United States Patent
Huang et al.

(10) Patent No.: US 7,147,042 B2
(45) Date of Patent: Dec. 12, 2006

(54) HEAT COLLECTOR

(75) Inventors: Jung-Fong Huang, Sanchong (TW); Chih-Chien Huang, Sansia Township, Taipei County (TW)

(73) Assignee: Forward Electronics Co., Ltd. (TW)

( * ) Notice: Subject to any disclaimer, the term of this patent is extended or adjusted under 35 U.S.C. 154(b) by 20 days.

(21) Appl. No.: 11/088,765

(22) Filed: Mar. 25, 2005

(65) Prior Publication Data
US 2006/0076122 A1   Apr. 13, 2006

(30) Foreign Application Priority Data
Oct. 8, 2004   (TW) .............................. 93216043 U

(51) Int. Cl.
*F28F 7/02*   (2006.01)

(52) U.S. Cl. ..................... 165/80.4; 165/80.5
(58) Field of Classification Search .............. 165/80.4, 165/80.5, 185; 361/699
See application file for complete search history.

(56) References Cited

U.S. PATENT DOCUMENTS

| 2004/0188063 A1* | 9/2004 | Chang | 165/80.3 |
| 2005/0167083 A1* | 8/2005 | Belady et al. | 165/80.3 |
| 2006/0032616 A1* | 2/2006 | Yang | 165/80.3 |

* cited by examiner

*Primary Examiner*—Teresa J. Walberg
(74) *Attorney, Agent, or Firm*—Bacon & Thomas PLLC

(57) ABSTRACT

An improved heat collector in a fluid-cooling system for a computer includes a case, and a cooling plate. The case comprises a water inlet, a water outlet, a top surface, and a bottom surface, wherein the bottom surface is a heat collecting face. The cooling plate is firmly connected to the top surface of the case, the cooling plate further comprising a plurality of cooling fins protruded upwards. A natural airflow can be formed among the cooling fins of the heat collector; therefore the heat collector can also radiate heat to air to improve the cooling efficiency.

8 Claims, 6 Drawing Sheets

HEAT COLLECTOR

BACKGROUND OF THE INVENTION

1. Field of the Invention

The present invention relates to an improved heat collector, and more particularly, to an improved heat collector in a fluid-cooling system for a computer.

2. Description of the Related Art

Please refer to FIG. 1, FIG. 2 and FIG. 3. FIG. 1 is an exploded view of a prior art fluid-cooling device for a computer. FIG. 2 shows separation of an upper cover from a lower cover of the prior art heat collector for a fluid-cooled computer. FIG. 3 is a front view of the prior art heat collector for a fluid-cooled computer.

A prior art heat collector 2 for a fluid-cooled computer is adhered onto a CPU 1 and serially connected to a cooler 3 to form a fluid-cooling circulation system. After the heat collector 2 absorbs heat from the CPU 1, heated fluid flows into the cooler 3 for cooling, and then cooled fluid flows back to the collector 2, which completes the fluid circulation loop. The prior art heat collector 2 for a fluid-cooling computer is composed of an upper cover 21, a heat collecting plate 23, and a lower cover 22. The prior art heat collector 2 utilizes a plurality of fins on the heat collecting plate 23 in the lower cover 22 to collect heat generated by the CPU 1, and a flowing fluid to carry the heat collected by the plurality of fins 231 to the cooler 3, or other portions, for cooling.

However, as CPUs operate at higher and higher speeds, increasing amounts of heat are being generated by these CPUs, making it necessary to have better computer fluid-cooling systems.

Therefore, it is desirable to provide an improved heat collector to mitigate and/or obviate the aforementioned problems.

SUMMARY OF THE INVENTION

A main objective of the present invention is to provide a heat collector improvement, which comprises a case, and a cooling plate. The case comprises a water inlet, a water outlet, a top surface, and a bottom surface, wherein the bottom surface is a heat collecting face. The cooling plate is firmly connected to the top surface of the case, the cooling plate further comprising a plurality of cooling fins protruded upwards.

A natural airflow can be formed among the cooling fins of the heat collector therefore the heat collector can also radiate heat to air to improve the cooling efficiency.

Furthermore, the case and the cooling plate are made of metal, and the cooling plate is welded (or screwed) and sealed onto the top surface of the case.

Other objects, advantages, and novel features of the invention will become more apparent from the following detailed description when taken in conjunction with the accompanying drawings.

DETAILED DESCRIPTION OF THE PREFERRED EMBODIMENT

Figure 1:
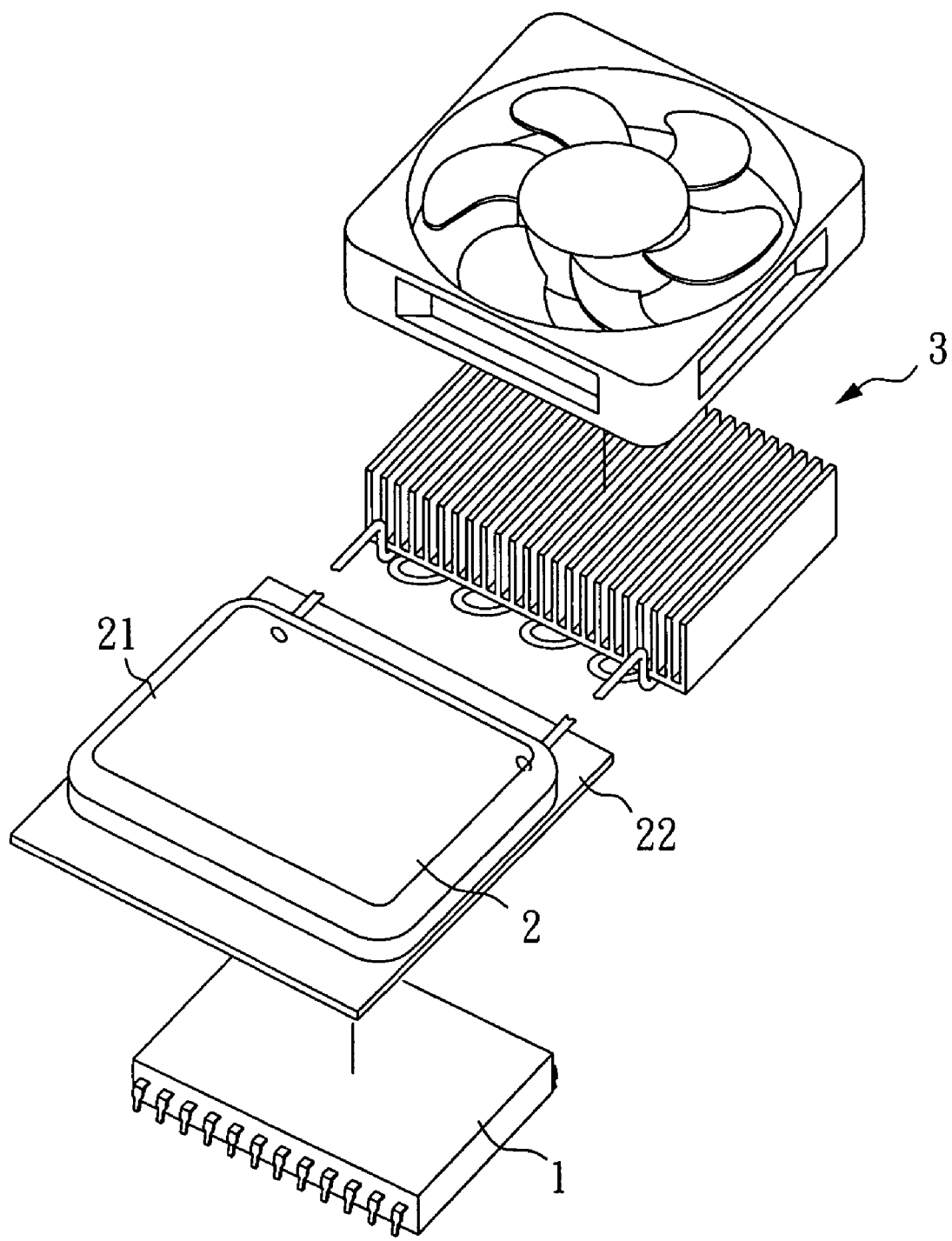
FIG. 1 is an exploded view of a prior art fluid-cooling device for computer.
Figure 2:
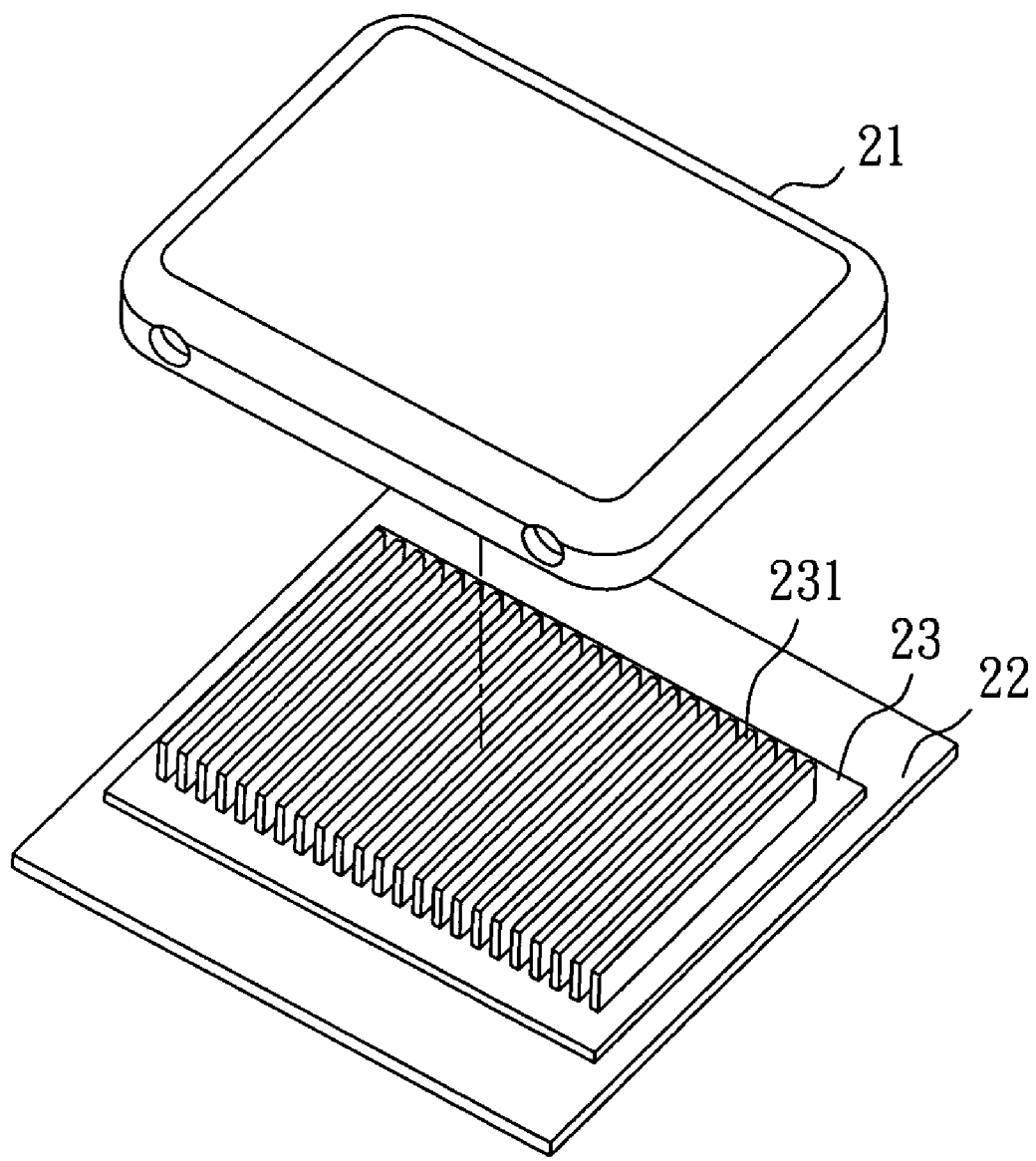
FIG. 2 is an exploded view of an upper cover and a lower cover of the prior art heat collector for a fluid-cooling computer.
Figure 3:
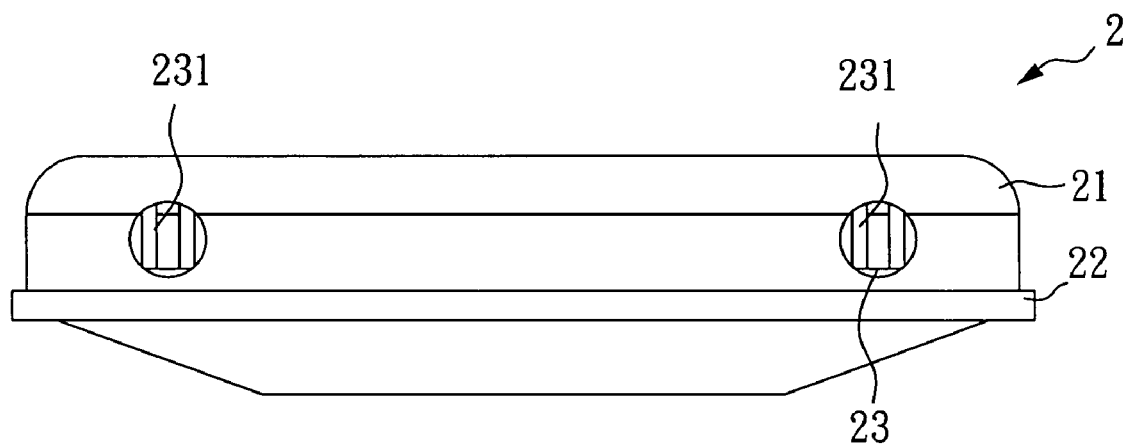
FIG. 3 is a front view of the prior art heat collector for a fluid-cooling computer.
Figure 4:
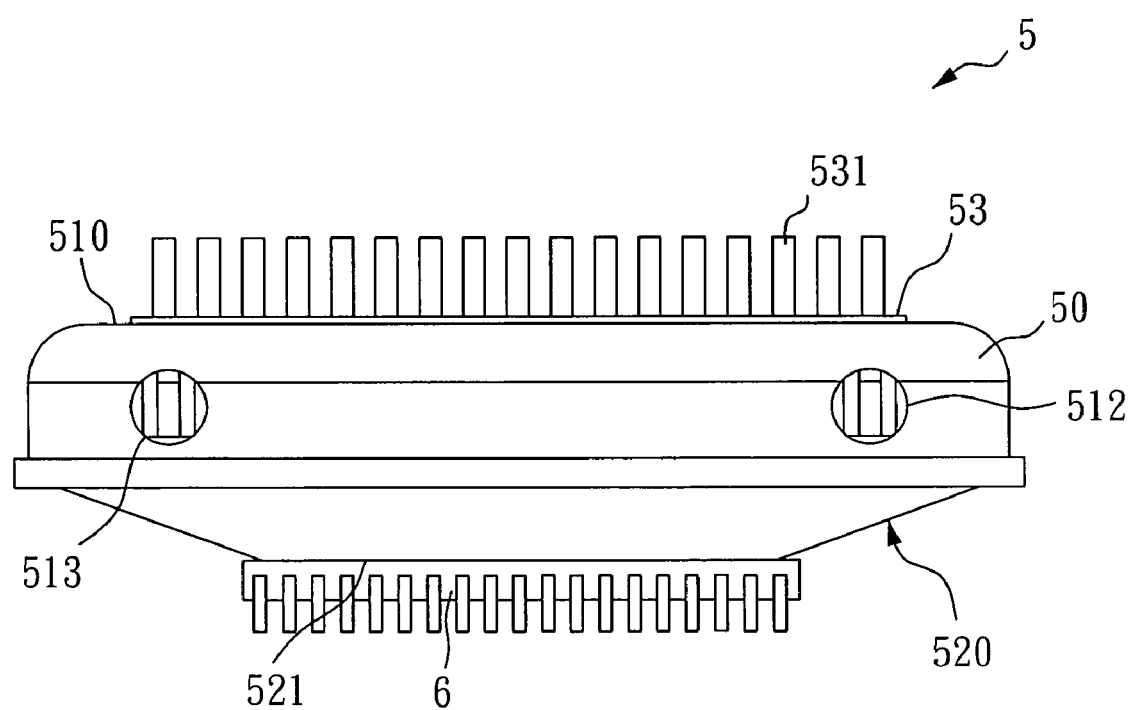
FIG. 4 is a front view of a preferred embodiment of an improved heat collector according to the present invention.

Please refer to FIG. 4. FIG. 4 is a front view of a preferred embodiment of an improved heat collector according to the present invention. As shown in the drawing, an improved heat collector 5 comprises: a case 50 which comprises a water inlet 512, a water outlet 513, a top surface 510, a bottom surface 520, and a cooling plate 53. The bottom surface 520 is a heat collecting face 521 and is adjusted for an exothermal electronic unit 6, such as a CPU. The cooling plate 53 is firmly connected to the top surface of the case, and the cooling plate further comprises a plurality of cooling fin 531 protruded upwards.

Figure 5:
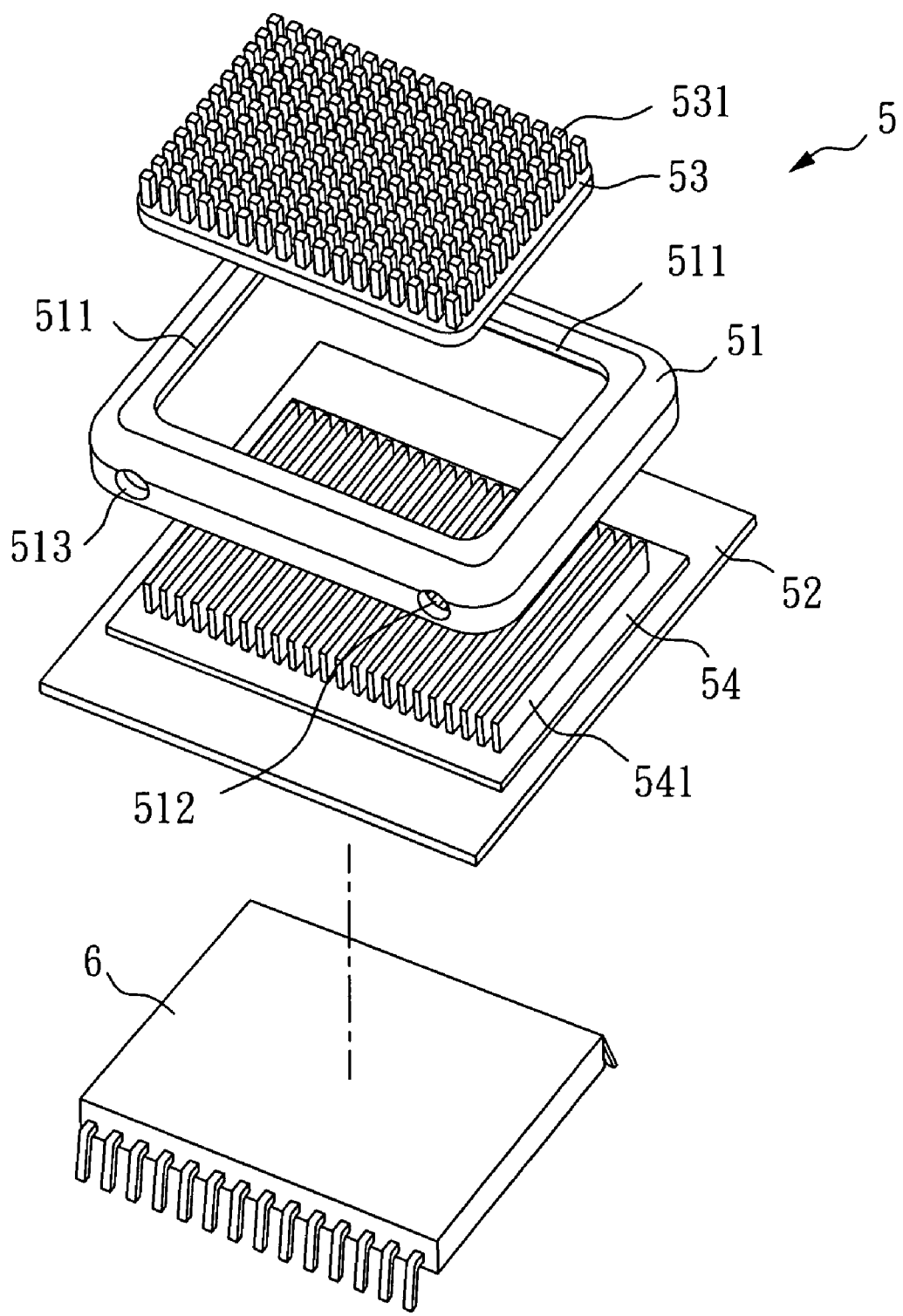
FIG. 5 is an exploded view of a preferred embodiment of a heat-improved collector according to the present invention.
Figure 6:
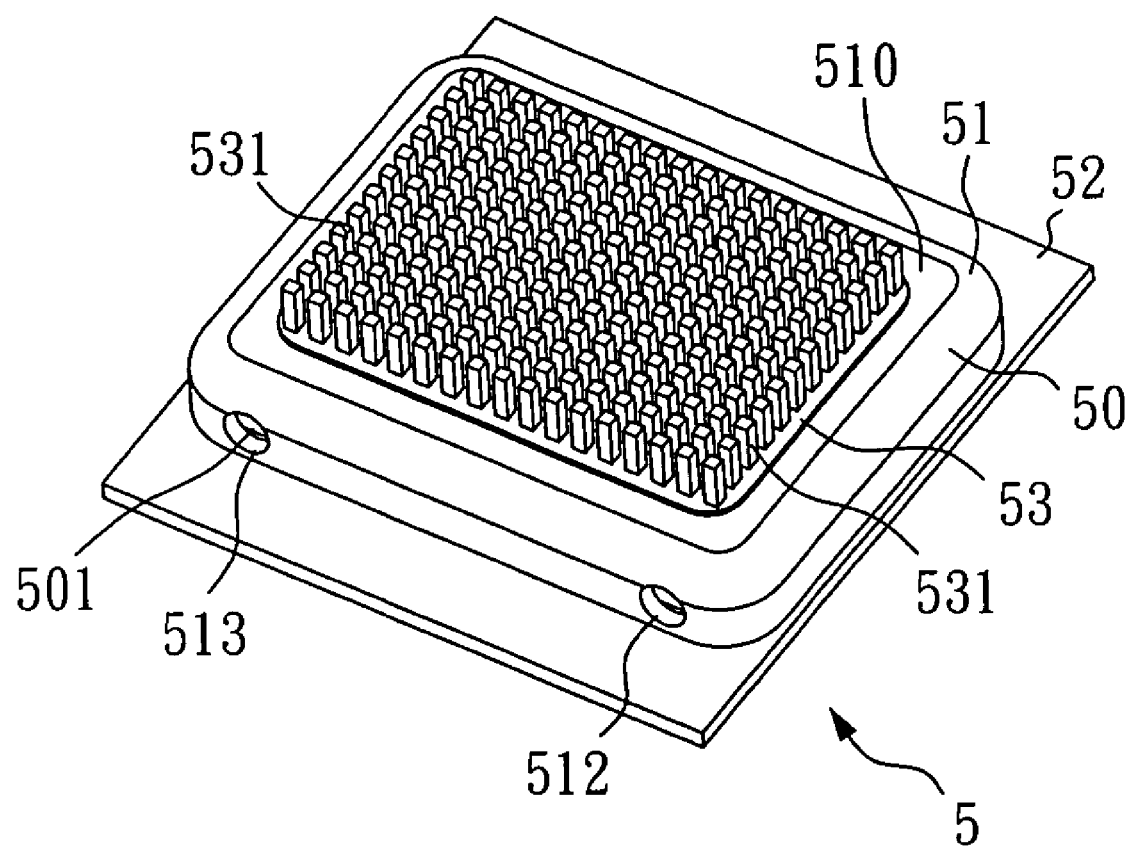
FIG. 6 is a perspective view of an improved heat collector according to the present invention.

Please refer to FIG. 5 and FIG. 6. FIG. 5 is an exploded view of a preferred embodiment of an improved heat collector according to the present invention. FIG. 6 is a perspective view of an improved heat collector according to the present invention. As shown in the drawing, the top surface 510 of the case 50 further comprises an opening 511, and the cooling plate 53 seals against the opening 511. The cooling plate 53 is welded and sealed onto the opening 511, or any other sealing method may be used. The case 50 further comprises a lower case 52 and an upper case 51 that covering the lower case 52. The water inlet 512 and the water outlet 513 may both be disposed on the upper case 51, or on the lower case 52, or separately disposed on the upper case 51 and the lower case 52. The case 50 also comprises an airtight chamber 501; the airtight chamber 501 comprises a plurality of partition strips 541 disposed on the lower case 52.

Please refer to FIG. 6 again. In the drawing, the case 50 is made of metal, such as copper.

The improved heat collector of the present invention has the following advantages:

(1) It is able to improve the cooling rate of the CPU or of other exothermal electronic units.

(2) It is able to directly and cool the exothermal electronic unit.

(3) It is able to radiate some heat with the cooling fins 531, while simultaneously using a moving fluid to transport the remaining heat to the cooling device.

Although the present invention has been explained in relation to its preferred embodiment, it is to be understood that many other possible modifications and variations can be made without departing from the spirit and scope of the invention as hereinafter claimed.

What is claimed is:

1. An improved heat collector comprising:
   a case comprising a water inlet, a water outlet, a top surface, and a bottom surface, wherein the bottom surface is a heat collecting surface; and
   a cooling plate firmly connected to the top surface of the case, the cooling plate further comprising a plurality of cooling fins protruded upwards;

wherein the top surface of the case has an opening for receiving and firmly connecting with the cooling plate therein.

2. The improved heat collector as claimed in claim 1, wherein the case comprises a lower case, and an upper case that covers the lower case.

3. The improved heat collector as claimed in claim 2, wherein the case further comprises an airtight chamber, the airtight chamber comprises a plurality of partition strips disposed on the lower case protruded upwards.

4. The improved heat collector as claimed in claim 2, wherein the water inlet and the water outlet are placed on the upper case respectively.

5. The improved heat collector as claimed in claim 1, wherein the cooling plate is welded and sealed onto the top surface of the case.

6. The improved heat collector as claimed in claim 2, wherein the upper case and the lower case are welded and sealed together.

7. The improved heat collector as claimed in claim 1, wherein the case is made of metal.

8. The improved heat collector as claimed in claim 1, wherein the heat-collecting surface of the bottom surface of said case is mounted onto an exothermal electronic unit.

* * * * *